United States Patent [19]

Tsukiji et al.

[11] Patent Number: 5,441,912
[45] Date of Patent: Aug. 15, 1995

[54] METHOD OF MANUFACTURING A LASER DIODE

[75] Inventors: Naoki Tsukiji, Tokyo; Hiroyuki Aida, Sapporo, both of Japan

[73] Assignee: The Furukawa Electric Co., Ltd., Tokyo, Japan

[21] Appl. No.: 199,640

[22] Filed: Feb. 22, 1994

[30] Foreign Application Priority Data

Jul. 28, 1993 [JP] Japan .................... 5-205725

[51] Int. Cl.⁶ ........................... H01L 21/20
[52] U.S. Cl. .................... 437/129; 437/130; 148/DIG. 95
[58] Field of Search ............... 437/225, 228, 129, 130; 148/DIG. 95

[56] References Cited

U.S. PATENT DOCUMENTS

| | | | |
|---|---|---|---|
| 4,525,841 | 6/1985 | Kitamura et al. | 372/48 |
| 4,566,171 | 1/1986 | Nelson et al. | 437/130 |
| 4,849,372 | 7/1989 | Takemoto | 437/129 |
| 4,984,244 | 1/1991 | Yamamoto et al. | 437/129 |
| 5,173,447 | 12/1992 | Ijichi et al. | 437/129 |
| 5,227,015 | 7/1993 | Fujihara et al. | 437/129 |
| 5,236,864 | 8/1993 | Iga et al. | 437/129 |

FOREIGN PATENT DOCUMENTS 63-202985  8/1988  Japan .

*Primary Examiner*—R. Bruce Breneman
*Assistant Examiner*—Linda J. Fleck
*Attorney, Agent, or Firm*—Jacobson, Price, Holman & Stern

[57] ABSTRACT

This invention provides a method of manufacturing laser diodes having a high efficiency and a high optical output and showing an excellent temperature-dependent performance at a high yield. The method comprises steps of forming a mesa on a p-type compound semiconductor substrate 1 by sequentially arranging at least a p-type compound semiconductor cladding layer 2, an active layer 3 and an n-type compound semiconductor compound layer 4, burying the lateral sides of said mesa with a p-type compound semiconductor buried layer 6 and an n-type compound semiconductor current blocking layer 7, removing said n-type compound semiconductor current blocking layer 7 partly at areas contacting each of the lateral sides of said mesa to partly expose the p-type compound semiconductor buried layer 6 in the vicinity of said mesa and then burying the remaining space with a p-type compound semiconductor current blocking layer 8.

2 Claims, 3 Drawing Sheets

METHOD OF MANUFACTURING A LASER DIODE

BACKGROUND OF THE INVENTION

FIELD OF THE INVENTION

This invention relates to a method of manufacturing a high efficiency/high output laser diode.

PRIOR ART

Buried heterostructure laser diodes are known to be advantageous over other laser diodes such as those of the refractivity waveguide type and the V-grooved substrate buried heterostructure type because they are susceptible to DFB (distributed feedback) processing and the use of a quantum well structure in the active layer of the device and show a low threshold current level.

A buried heterostructure laser diode is typically manufactured through the steps as shown in FIGS. 4(a) through (d) of the accompanying drawings and described below. (See Japanese Patent Application KOKAI Publication No. 63-202985.)

1) A p-InP cladding layer 2, an InGaAsP active layer 3 and an n-InP cladding layer are sequentially formed on a p-InP substrate 1 by epitaxial growth. Thereafter, the p-InP substrate 1 carrying the layers is taken out of the growth system and a stripe of silicon oxide film 5 is formed on the upper surface of the multilayer structure (FIG. 4(a)).

2) Then, the multilayer structure is etched down to the p-InP substrate to produce a mesa on the substrate by using the silicon oxide film 5 as a mask (FIG. 4(b)).

3) Thereafter, the multilayer structure is put into a liquid phase epitaxial growth system with the mask sticking to the top of the mesa and a p-InP buried layer 6, an n-InP current blocking layer 7 and a p-InP current blocking layer 8 are sequentially formed on the p-InP substrate 1 (FIG. 4 (c)).

4) Then, the mask is removed and an n-InP cladding layer 9 and an n-InGaAsP contact layer 10 are sequentially formed thereon. With this growth process, it is necessary to separate the n-InP current blocking layer 7 and the n-InP cladding layer 9 for current confinement because otherwise the two layers may be held in contact with each other. If the low resistance n-InP current blocking layer 7 contacts with the n-InP cladding layer 9 to produce a leakage current path, the flow rate of leakage current will be remarkably increased to undermine any effort to provide a laser diode having desired characteristics. With a technique for avoiding the formation of a leakage current path, either or both of the p-InP buried layer 6 and the p-InP current blocking layer 8 are made to contain impurities to a high concentration level during the process of crystal growth and, after the completion of the process, the impurities in either or both of the p-InP buried layer 6 or the p-InP current blocking layer 8 are made to diffuse into the n-InP current blocking layer 7. With such an arrangement, the n-InP current blocking layer partly converted to p-type at and near the mesa to prevent any possible contact of the n-InP current blocking layer 7 and the n-InP cladding layer 9. Finally, a p-electrode 11 and an n-electrode 12 are formed to complete the manufacturing operation (FIG. 4(d)).

A known laser diodes using p-type substrate as described above is, however, accompanied by problems as enumerated below.

1) Either or both of the p-InP buried layer or the p-InP current blocking layer have to be made to contain impurities to a high concentration level in order to cause the n-InP current blocking layer to be partly converted to p-type at and near the mesa. Consequently, a leakage current can flow from the n-InP cladding layer in the mesa to the p-InP buried layer and the device can deteriorate its temperature-dependent performance. Additionally, if the active layer is made to have a quantum well structure, the p-type impurities in the p-InP buried layer can enter the active layer to form mixed crystals there and practically reduce the quantum effect to nil.

2) The n-InP current blocking layer has to be rigorously controlled for its height in order to prevent the n-InP current blocking layer from contacting the n-InP cladding layer, although the height is as small as 0.1 to 0.3 $\mu$m and hardly controllable in the process of liquid phase epitaxial growth. Consequently, the n-InP current blocking layer can inadvertently be made to contact with the n-InP cladding layer within the mesa and/or the n-InP buried layer can significantly retreat to degrade the device, leading to a poor yield for the manufacturing.

SUMMARY OF THE INVENTION

It is, therefore, an object of the present invention to provide a method of manufacturing a laser diode that is free from the above identified problems. According to a first aspect of the invention, this object is achieved by providing a method of manufacturing a laser diode comprising steps of forming a mesa on a p-type compound semiconductor substrate by sequentially arranging at least a p-type compound semiconductor cladding layer, an active layer and an n-type compound semiconductor compound layer, burying the lateral sides of said mesa with a p-type compound semiconductor buried layer and an n-type compound semiconductor current blocking layer, removing said n-type compound semiconductor current blocking layer partly at areas contacting each of the lateral sides of said mesa to partly expose the p-type compound semiconductor buried layer in the vicinity of said mesa and then burying the remaining space with a p-type compound semiconductor current blocking layer. According to a second aspect of the invention, the step of removing the n-type compound semiconductor current blocking layer at areas contacting the respective lateral sides of said mesa is carried out by an LPE technique involving meltbacks.

With a method of manufacturing a laser diode according to the invention as disclosed above, after forming a n-type compound semiconductor current blocking layer on a semiconductor substrate carrying a mesa thereon, it is partly removed at areas contacting the respective lateral sides of the mesa to partly expose a p-type compound semiconductor buried layer that has been already formed in the vicinity of said mesa and then burying the remaining space on the substrate with a p-type compound semi-conductor current blocking layer so that the finished device shows a structure where the n-type compound semiconductor current blocking layer is almost enclosed by a p-type compound semiconductor buried layer and a p-type compound current blocking layer. With such an arrangement, no leakage current path will be formed due to direct contact of the n-type compound semiconductor current blocking layer and the n-type compound semiconductor cladding layer of the device even if the film thickness of the layers and the concentration of impurities in the related layers are not rigorously controlled so that laser diodes of the type under consideration may be manufactured with an enhanced yield.

Now, the present invention will be described in greater detail by referring to the accompanying drawings illustrating some of the best modes of carrying out the invention.

BEST MODES OF CARRYING OUT THE INVENTION

Figure 1A:
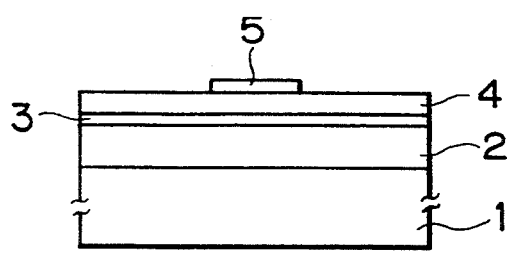
FIGS. 1(a) through (f) are schematic sectional views of a laser diode being manufactured in a preferable mode of carrying out the invention, showing different manufacturing steps.

FIGS. 1(a) through (f) are schematic sectional views of a laser diode being manufactured in a best mode of carrying out the invention. This mode comprises the following steps.

1) A p-InP cladding layer 2, an InGaAsP active layer 3 and an n-InP cladding layer 4 are sequentially formed on a p-InP substrate 1 by epitaxial growth. Thereafter, the p-InP substrate 1 carrying the layers is taken out of the growth system and a stripe of silicon oxide film 5 is formed on the upper surface of the multilayer structure (FIG. 1(a)).

Figure 1B:
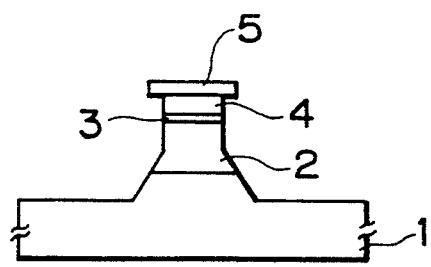

2) Then, the multilayer structure is etched down to the p-InP substrate to produce a mesa on the substrate by using the silicon oxide film 5 as a mask (FIG. 1(b)).

Figure 1C:
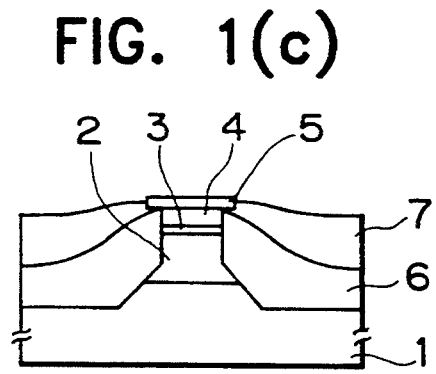

3) Thereafter, the multilayer structure is put into a liquid phase epitaxial growth system with the mask sticking to the top of the mesa and a p-InP buried layer 6 and an n-InP current blocking layer 7 are sequentially formed on the p-InP substrate 1 (FIG. 1(c)). It will be seen that the above steps are same as those of the conventional method described earlier.

Figure 1D:
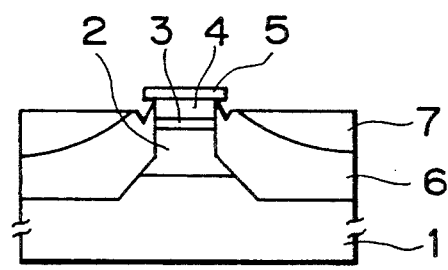

4) Then, the formed semiconductor layers are partly removed from above except the portion lying under the mask until the n-InP current blocking layer 7 does not contact with the mesa any longer (FIG. 1(d)).

This step may be conducted by means of an etching technique using a mixed solution of fluorine and methanol or by causing unsaturated melt packs (e.g., Indium melt in a liquid phase) to contact with the wafer. The use of melt is advantageous in that this step can be carried out in the same liquid phase growth system without interruption.

Figure 1E:
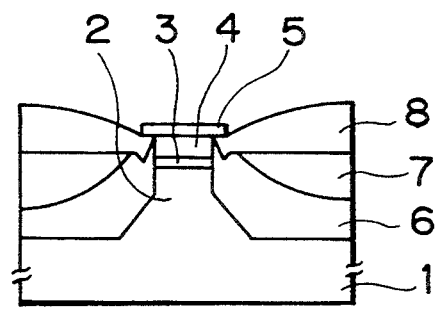
Figure 1F:
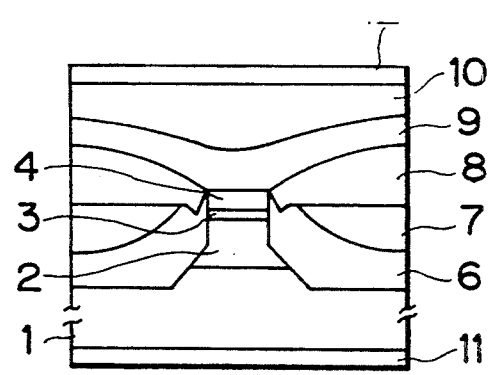

5) Thereafter, a p-InP current blocking layer 8 is made to grow (FIG. 1(e)).

6) Then, the mask is removed and an n-InP cladding layer 9 and an n-InGaAsP contact layer 10 are sequentially formed thereon. Finally, a p-electrode 11 and an n-electrode 12 are formed to complete the manufacturing operation (FIG. 1(f)).

Figure 2:
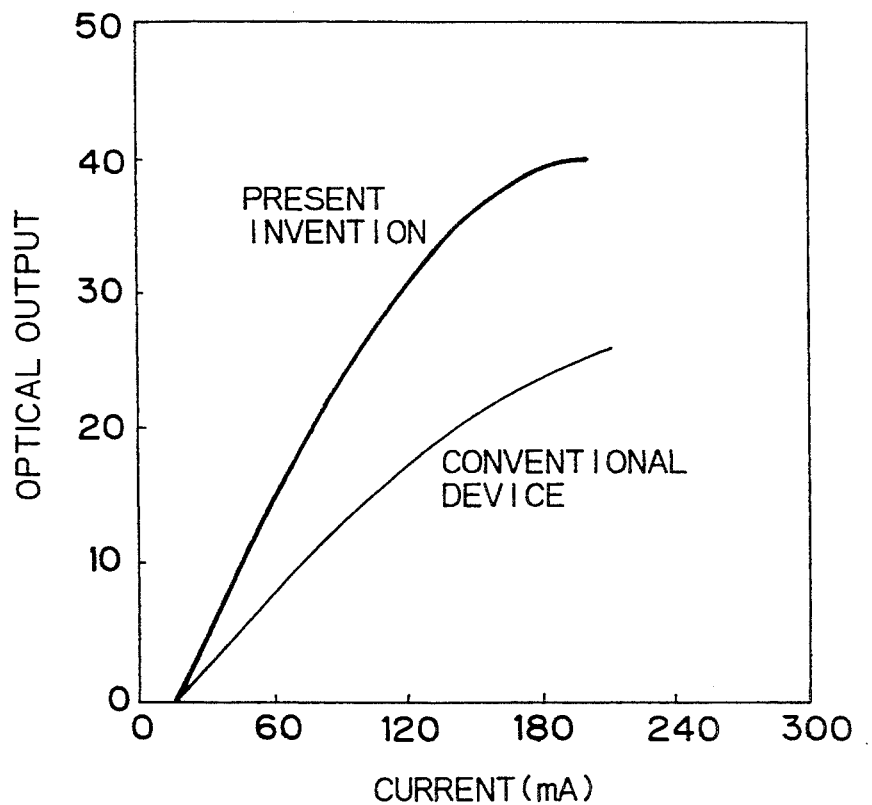
FIG. 2 is a graph showing the relationship between the electric current and the optical output of a laser diode manufactured by the method of FIGS. 1(a) through (f).

In an experiment conducted by using laser devices manufactured by the above method and comparable conventional laser diodes, it was proved that a laser diode manufactured by the method of the present invention shows a greater optical output than a conventional laser diode having the same dimensions as seen in FIG. 2 illustrating the electric current-optical output relationship for each of the compared laser diodes. The former laser diode also showed an excellent temperature-dependent performance and repeatedly proved to have a threshold current level of 10mA at 85° C. Incidentally, it was practically impossible to realize laser oscillation with the latter device at 85° C. and the threshold current level was approximately 15mA at best.

Figure 3:
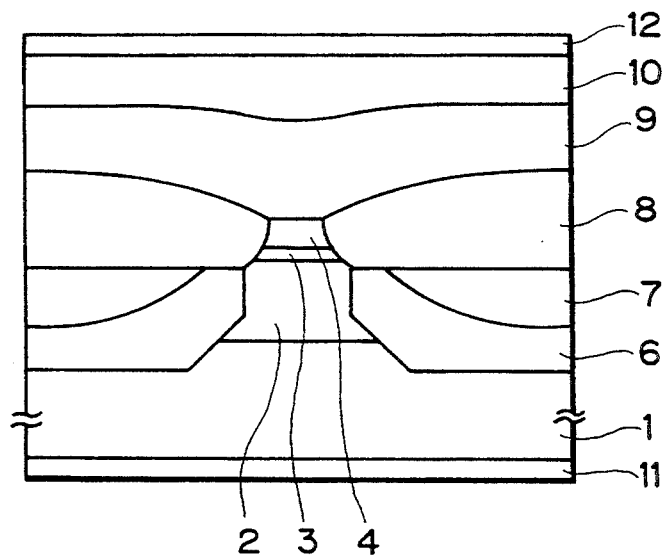
FIG. 3 is a schematic sectional view of a laser diode manufactured in another mode of carrying out the invention.
Figure 4A:
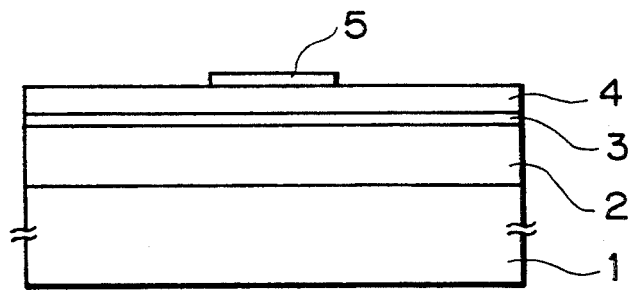
FIGS. 4(a) through 4(d) are schematic sectional views of a laser diode being manufactured by a conventional method.
Figure 4B:
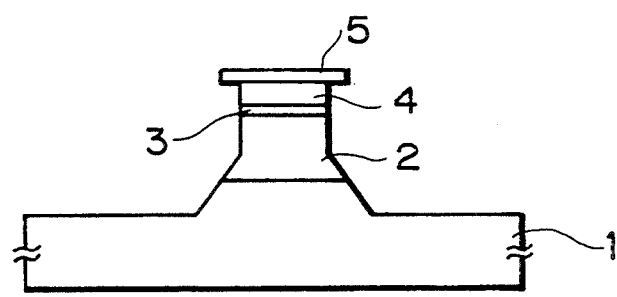
Figure 4C:
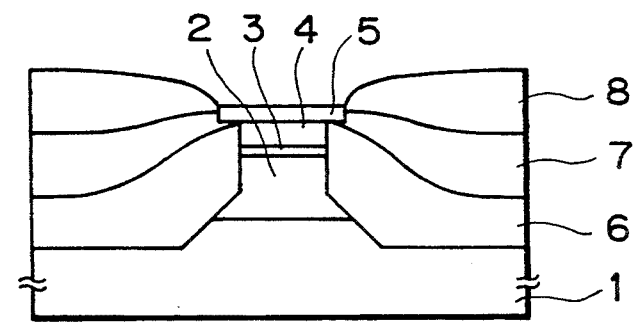
Figure 4D:
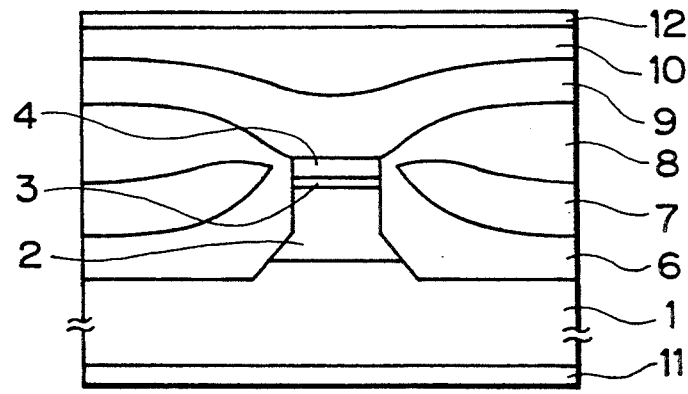

FIG. 3 shows a schematic sectional view of a laser diode manufactured in another preferable mode of carrying out the invention. This mode is different from the above described mode in that, with this mode, the active layer 3 in the mesa is partly removed by means of meltbacks and the p-InP buried layer 6 is held in contact with the p-InP current blocking layer 8 at areas lower than the active layer. Meanwhile, it is known that if the active layer of a laser diode contains aluminum, aluminum oxide is formed during the etching operation for producing a mesa and the finished product is subject to degradation due to the formed aluminum oxide during laser oscillation. Since the etched surface areas are removed by means of meltbacks in the course of manufacturing a laser diode by the method of the invention and layers are made to grow on the intermediary product without taking it out of the growth system so that the lateral sides of the active layer is not subjected to oxidation and consequently the finished devices can enjoy an improved reliability.

Note that a p-type InP substrate is used in the above description, it may be replaced with a different semiconductor substrate containing an AlGaAs or GaP type compound.

As described above, according to the invention, there is provided a method of manufacturing a laser diode comprising steps of forming a mesa on a p-type compound semiconductor substrate by sequentially arranging at least a p-type compound semiconductor cladding layer, an active layer and an n-type compound semiconductor compound layer, burying the lateral sides of said mesa with a p-type compound semiconductor buried layer and an n-type compound semiconductor current blocking layer, removing said n-type compound semiconductor current locking layer partly at areas contacting the respective lateral sides of said mesa to partly expose the p-type compound semiconductor buried layer in the vicinity of said mesa and then burying the remaining space with a p-type compound semiconductor current blocking layer. With such an arrangement, no leakage current path will be formed due to direct contact of the n-type compound semiconductor current blocking layer and the n-type compound semiconductor cladding layer of the device even if the film thickness of the layers and the concentration of impurities in the related layers are not rigorously controlled so that laser diodes of the type under consideration may be manufactured with an enhanced yield.

What is claimed is:

1. A method of manufacturing a laser diode comprising steps of forming a mesa on a p-type compound semiconductor substrate by sequentially forming on the p-type compound semiconductor substrate at least a p-type compound semiconductor cladding layer, an active layer and an n-type compound semiconductor compound layer, burying on the lateral sides of said mesa a p-type compound semiconductor buried layer and an n-type compound semiconductor current blocking layer, partly removing said n-type compound semiconductor current blocking layer at areas contacting each of the lateral sides of said mesa to partly expose the p-type compound semiconductor buried layer in the vicinity of said mesa, and then burying in the remaining space in the areas contacting each of the lateral sides of said mesa a p-type compound semiconductor current blocking layer.

2. A method of manufacturing a laser diode according to claim 1, wherein the step of removing the n-type compound semiconductor current blocking layer at areas contacting the lateral sides of said mesa is carried out by an LPE technique involving meltbacks.

* * * * *